(12) United States Patent
Yoshii et al.

(10) Patent No.: US 8,879,349 B2
(45) Date of Patent: Nov. 4, 2014

(54) STORAGE DEVICE

(71) Applicant: Kabushiki Kaisha Toshiba, Minato-ku (JP)

(72) Inventors: Kenichiro Yoshii, Tokyo (JP); Ikuo Magaki, Kanagawa (JP); Naoto Oshiyama, Tokyo (JP); Tokumasa Hara, Kanagawa (JP); Akira Yamaga, Kanagawa (JP); Ryo Yamaki, Kanagawa (JP); Kenta Yasufuku, Tokyo (JP); Naomi Takeda, Kanagawa (JP); Yu Nakanishi, Kanagawa (JP); Arata Miyamoto, Tokyo (JP); Naoaki Kokubun, Kanagawa (JP); Daisuke Iwai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/960,186

(22) Filed: Aug. 6, 2013

(65) Prior Publication Data
US 2014/0241096 A1 Aug. 28, 2014

Related U.S. Application Data

(60) Provisional application No. 61/769,304, filed on Feb. 26, 2013.

(51) Int. Cl.
*G11C 5/14* (2006.01)

(52) U.S. Cl.
CPC . *G11C 5/148* (2013.01); *G11C 5/14* (2013.01)
USPC .......... 365/227; 365/185.11; 365/226

(58) Field of Classification Search
CPC .......... G11C 5/14; G11C 5/143; G11C 5/147; G11C 5/148
USPC ........ 365/227, 226, 185.11, 230.03; 713/320, 713/324, 330
See application file for complete search history.

(56) References Cited

U.S. PATENT DOCUMENTS

| | | | |
|---|---|---|---|
| 4,730,268 A | | 3/1988 | Marin |
| 6,016,270 A | * | 1/2000 | Thummalapally et al. .................. 365/185.11 |
| 7,663,956 B2 | * | 2/2010 | Ishikawa .................. 365/222 |
| 8,145,828 B2 | | 3/2012 | Ouchi |
| 2003/0179637 A1 | * | 9/2003 | Elzur et al. .................. 365/230.03 |
| 2011/0238928 A1 | | 9/2011 | Abe et al. |
| 2013/0117503 A1 | * | 5/2013 | Nellans et al. .................. 711/103 |

FOREIGN PATENT DOCUMENTS

| | | |
|---|---|---|
| JP | 8-33875 | 3/1996 |
| JP | 11-242632 | 9/1999 |
| JP | 2010-49586 | 3/2010 |
| JP | 4684673 | 2/2011 |
| JP | 2011-203905 | 10/2011 |

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A storage device according to an embodiment includes first and second non-volatile semiconductor memories. In addition, the storage device includes first controller that controls the first non-volatile memory to cause the first non-volatile memory to perform processes. In addition, the storage device includes second controller that controls the second non-volatile memory to cause the second non-volatile memory to perform processes. The storage device further includes a signal line which is connected to the first controller and the second controller and through which a token is transmitted between the first controller and the second controller. The first controller is capable of controlling the first non-volatile memory while holding the token and the second controller is capable of controlling the second non-volatile memory while holding the token.

16 Claims, 11 Drawing Sheets

FIG.12

| NAND NUMBER | RESERVATION START TIME | RESERVATION END TIME | VALID FLAG |
|---|---|---|---|
| 0 | $t_{C0}$ | $t_C$ | VALID |

FIG.13

| NAND NUMBER | RESERVATION START TIME | RESERVATION END TIME | VALID FLAG |
|---|---|---|---|
| 1 | $t_0+t_{A0}$ | $t_0+t_A$ | VALID |
| 0 | $t_{C0}$ | $t_C$ | VALID |

US 8,879,349 B2

STORAGE DEVICE

CROSS-REFERENCE TO RELATED APPLICATIONS

This application is based upon and claims the benefit of priority from U.S. Provisional Application No. 61/769,304), filed on Feb. 26, 2013; the entire contents of which are incorporated herein by reference.

FIELD

Embodiments described herein relate generally to storage devices.

BACKGROUND

In recent years, the capacity of a NAND flash memory, which is a non-volatile semiconductor storage device, has increased and attention has been paid to an SSD (Solid State Drive) provided with the NAND flash memory.

In the SSD, the number of NAND flash memories which are operated at the same time tends to increase in order to improve the data access performance. However, when the number of NAND flash memories which are operated at the same time increases, power consumption (current consumption) increases during data access. Therefore, it is preferable to reduce the maximum power consumption (peak power) of the storage device during data access.

BRIEF DESCRIPTION OF THE DRAWINGS

FIG. 12 is a diagram illustrating a reservation table in which a third process having the first half consuming a small amount of power is registered;

FIG. 13 is a diagram illustrating a reservation table in which the third process having the first half consuming a small amount of power is registered and the first process is registered in the front stage of the third process;

DETAILED DESCRIPTION

According to an embodiment, a storage device is provided. The storage device includes first non-volatile memory and second non-volatile memory. In addition, the storage device includes first controller that controls the first non-volatile memory to cause the first non-volatile memory to perform processes. In addition, the storage device includes second controller that controls the second non-volatile memory to cause the second non-volatile memory to perform processes. The storage device further includes a signal line which is connected to the first controller and the second controller and through which a token is transmitted between the first controller and the second controller. The first controller is capable of controlling the first non-volatile memory while holding the token and the second controller is capable of controlling the second non-volatile memory while holding the token.

Hereinafter, storage devices according to embodiments will be described in detail with reference to the accompanying drawings. The invention is not limited by the embodiments. In this embodiment, power consumption means power consumption or current consumption per unit time. In the following description, power consumption or current consumption per unit time is referred to as power consumption.

First Embodiment

Figure 1:
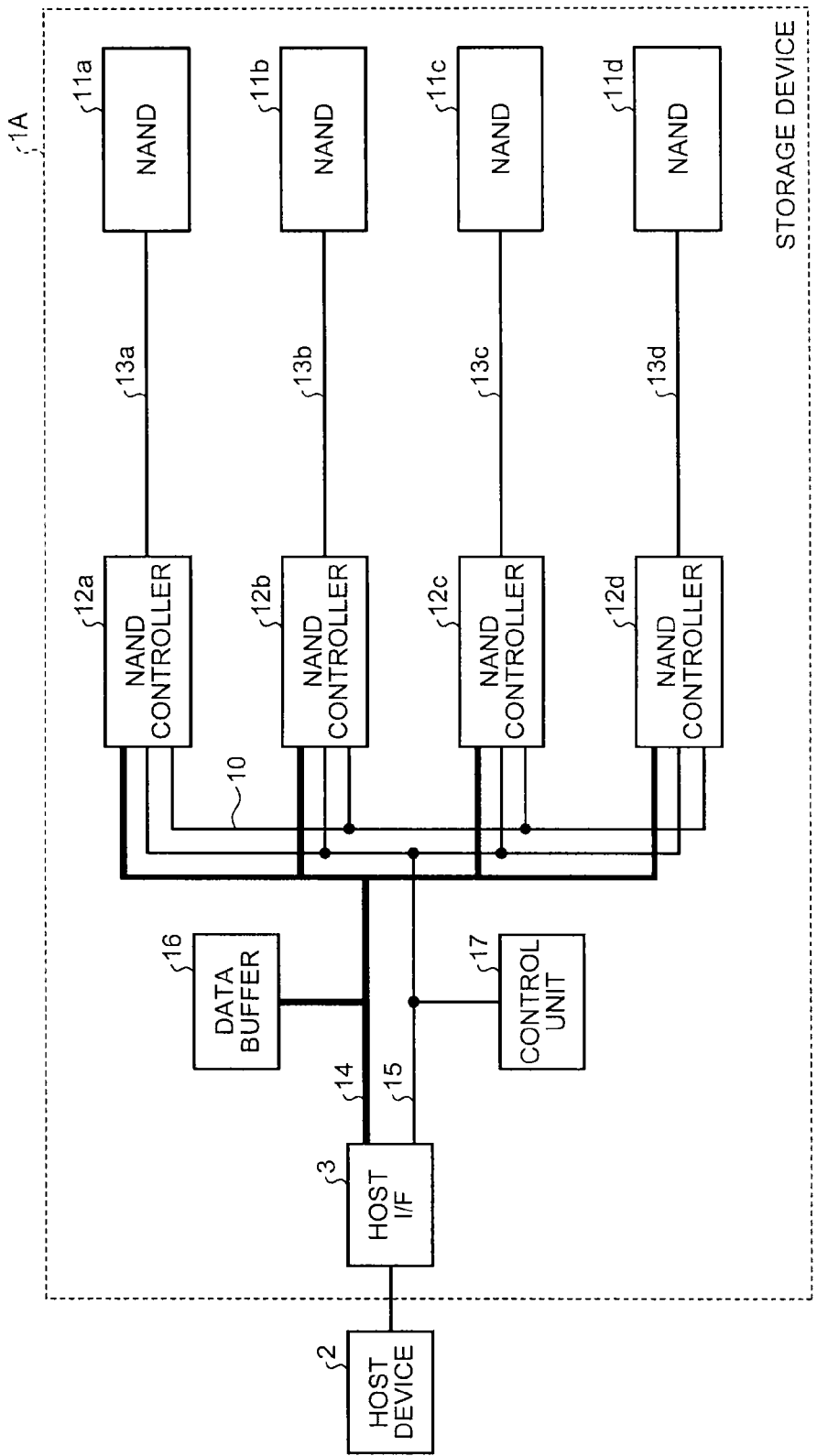
FIG. 1 is a diagram illustrating the structure of a storage device according to a first embodiment.

FIG. 1 is a diagram illustrating the structure of a storage device according to a first embodiment. A storage device (memory system) 1A is an external storage device used in a computer system and is, for example, an SSD (Solid State Drive). The storage device 1A is an information storage device having, for example, a semiconductor storage element (non-volatile semiconductor memory) as a non-volatile storage medium.

In the storage device 1A according to this embodiment, a mark (token) indicating that a semiconductor storage element is allowed to perform a process is circulated between controllers (for example, NAND controllers 12a to 12d) for controlling a plurality of semiconductor storage elements (for example, NAND 11a to NAND 11d). In the storage device 1A, while a predetermined semiconductor storage element is operating, the mark is not transmitted to other controllers. In this way, the number of semiconductor storage elements which operate at the same time is limited. The operation of the storage device 1A reduces the maximum power consumption (peak power) of a plurality of semiconductor storage elements.

The storage device 1A includes non-volatile storage elements, such as the NANDs (NAND flash memories) 11a to 11d, and the NAND controllers 12a to 12d for controlling the NANDs 11a to 11d. In addition, the storage device 1A includes a data buffer 16, a control unit 17, a host I/F (interface) 3, and a signal line 10.

The NAND controllers 12a to 12d control the NANDs 11a to 11d, respectively. Therefore, the NAND controller 12a is connected to the NAND 11a by a NAND channel 13a and the NAND controller 12b is connected to the NAND 11b by a NAND channel 13b. The NAND controller 12c is connected to the NAND 11c by the NAND channel 13c and the NAND controller 12d is connected to the NAND 11d by a NAND channel 13d.

As such, in the storage device 1A, one NAND controller is arranged for one corresponding NAND flash memory (for example, one chip) and is connected to the corresponding NAND flash memory by a NAND channel.

In this embodiment, four NANDs 11a to 11d are non-volatile storage elements. However, the number of NANDs is not particularly limited. In the following description, in some cases, the NANDs 11a to 11d are referred to as NANDs 11 and the NAND controllers 12a to 12d are referred to as NAND controllers 12.

Each NAND controller 12 is connected to the data buffer 16 through a data bus (hereinafter, referred to as a data bus 14) in the controller. In addition, each NAND controller 12 is connected to a storage device control unit (control unit 17) through a control bus (hereinafter, referred to as a control bus 15) in the controller.

In this embodiment, the NAND controllers 12a to 12d are connected to each other by the signal line 10. The signal line 10 is used to notify each NAND 11 of an operation allowance mark (token). Each NAND controller 12 transmits and receives a notice (token) indicating that the NAND 11 is allowed to perform a process, using the signal line 10. As such, in the storage device 1A, the constraints that only the NAND controller 12 with the token instructs the NAND 11 to start a process are given to the NAND controller 12.

The host I/F 3 is connected to the data bus 14 and the control bus 15. In addition, the host I/F 3 is connected to a host device 2 which is an external device as viewed from the storage device 1A.

The data buffer 16 is a storage device (storage area) which temporarily stores data exchanged between the host device 2 and the NAND 11. The control unit 17 controls the NAND controllers 12. The control unit 17 may be a combination of a general-purpose processor and software which operates on the general-purpose processor, or dedicated hardware. The control unit 17 does not depend on this embodiment.

Figure 2:
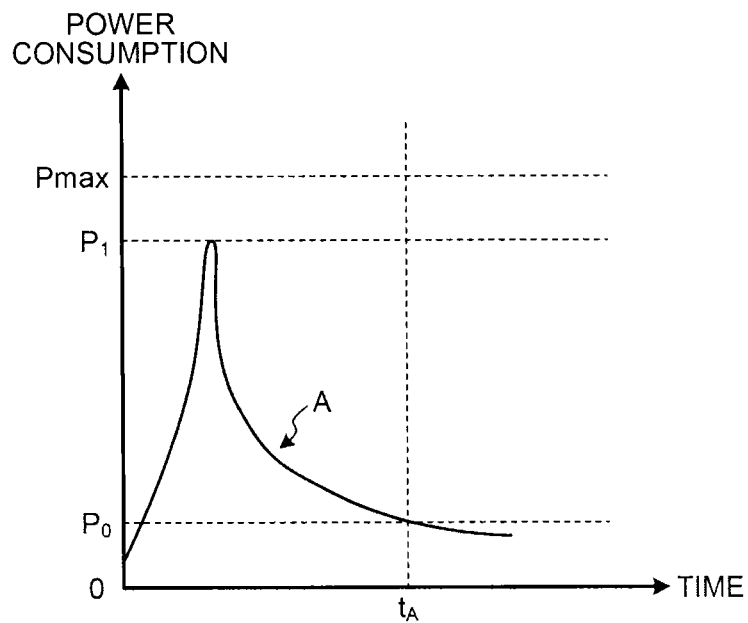
FIG. 2 is a diagram illustrating the transition characteristics of power consumption when a first process is performed for a NAND once.

FIG. 2 is a diagram illustrating the transition characteristics of power consumption (power consumption transitional characteristics) when a first process is performed for the NAND once. Next, the relation between the time elapsed from the start of a process and power consumption when a process A (first process) is performed for the NAND 11 will be described. In FIG. 2, the horizontal axis is time and the vertical axis is power consumption. The transition characteristics of the power consumption of, for example, the process A or processes B and C, which will be described below, are set in the NAND controller 12 in advance.

The process A is anyone of the writing of data to the NAND 11, the reading of data from the NAND 11, and the erasing of data from the NAND 11. In FIG. 2, Pmax indicates the allowable maximum instantaneous power consumption (a maximum value allowed as a peak value) of the computer system including the storage device 1A. In other words, Pmax indicates the allowable peak value (allowable value) of power consumed by a processing operation of the NAND 11. In addition, $P_1$ is the maximum power consumption (peak value) of the process A and $P_0$ is a value obtained by subtracting $P_1$ from Pmax. Furthermore, $t_A$ is the time (the time elapsed from the origin (time 0)) when the power consumption of the process A is finally equal to $P_0$. As such, the power consumed by the process of the NAND 11 varies over time.

When the process A with the above-mentioned characteristics is simultaneously performed for two NANDs 11, a power consumption of (power consumption more than $P_{max}$) of $2 \times P_1$ occurs instantaneously. Therefore, in this embodiment, the NAND controller 12 transmits and receives the token through the signal line 10 to prevent the power consumption of the NAND 11 from being instantaneously more than Pmax. Specifically, the NAND controller 12 instructs the corresponding NAND 11 to start a process at the time when the peak value of the power consumed by the processing operation of a plurality of NANDs 11 is not greater than an allowable value (a value less than the power consumption of the entire storage device 1A) even when the NAND controller 12 instructs the corresponding NAND 11 to start the process.

As such, the NAND controller 12 transmits and receives the token at any time on the basis of the transition characteristics of power consumption such that the total (sum) of the power consumed by the processing operations of a plurality of NANDs 11 is not more than the allowable value of power consumption at any time.

As initial settings, in the storage device 1A, the token is set to any NAND controller 12 when the storage device 1A starts. When receiving the token from other NAND controllers 12, each NAND controller 12 instructs the NAND 11 which is controlled by the NAND controller 12 to perform a process. The NAND controller 12 which has instructed the start of the process transmits the token to the next (another) NAND controller 12 through the signal line 10. In this case, it is assumed that the NAND controller 12 which has instructed the start of the process transmits the token to the next NAND 11 (for example, the NAND 11b) after the time depending on the kind of started process has elapsed from the time when the NAND 11 (for example, the NAND 11a) has been instructed to start the process.

In this embodiment, the constraints and the process of controlling the transmission time of the token prevent the total power consumption of the plurality of NANDs 11a to 11d from being more than the allowable maximum power consumption value of the computer system.

Figure 3:
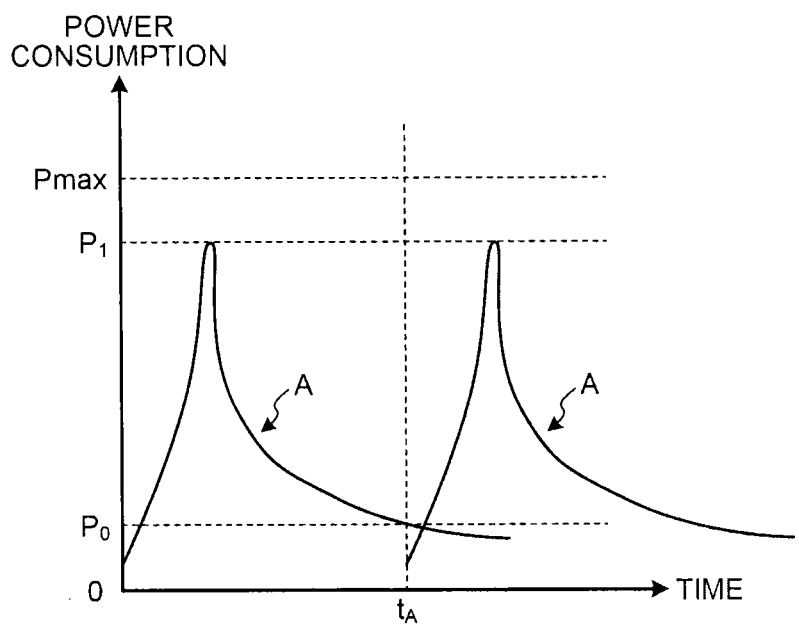
FIG. 3 is a diagram illustrating the transition characteristics of power consumption when the first process is continuously performed for each of two NANDs.

Next, a method of determining the transmission time of the token will be described. FIG. 3 is a diagram illustrating the transition characteristics of power consumption when the first process is continuously performed for two NANDs once. The relation between the time elapsed from the start of the process and power consumption when the process A is performed for the first NAND 11 (for example, the NAND 11a) and is then performed for the second NAND 11 (for example, the NAND 11b) will be described. In FIG. 3, the horizontal axis is time and the vertical axis is power consumption. In all graphs indicating the transition characteristics of power consumption in the following drawings, the horizontal axis is time and the vertical axis is power consumption.

As illustrated in FIG. 3, the storage device 1A starts the subsequent process A after a time $t_A$ has elapsed from the start of the preceding process A. For example, the NAND controller 12b instructs the NAND 11b to start the process A after the time $t_A$ has elapsed from the time when the NAND controller 12a has instructed the NAND 11a to start the process A.

The time $t_A$ is the time required for the power consumption of the process A to be finally less than $P_0$ (threshold value). Therefore, after the time $t_A$ from the start of the preceding process A, the power consumption of the preceding process A is not more than $P_0$.

The power consumption of the subsequent process A is a maximum of $P_1$ and the sum of $P_1$ and $P_0$ is $P_{max}$. Therefore, when the subsequent process A starts after the time $t_A$ has elapsed from the start of the preceding process A, the sum of the power consumption of the two processes A is not more than $P_{max}$.

Therefore, when the NAND controller 12 having the token transmits the token to the next NAND controller 12 after the time $t_A$ has elapsed from the time when the NAND controller 12 has instructed the NAND 11 which is managed by the NAND controller 12 to start the process A, the sum of the power consumption of the two processes A is not more than $P_{max}$.

In other words, for the period from the start of the process A by a given NAND 11 to the time $t_A$, another NAND 11 is prevented from starting the process A. In this case, even when the process A overlaps between two NANDs 11, there is no time period for which power consumption is more than $P_{max}$. This is because the next NAND controller 12 instructs the NAND 11 which is managed by the NAND controller 12 to start the process A after the time $t_A$ has elapsed from the start of the preceding process A.

As such, the NAND controller 12 transmits the token to the next NAND controller 12 at the time when the sum of the power consumption of two processes A is not more than $P_{max}$. Therefore, it is possible to achieve the transition of power consumption illustrated in FIG. 3.

In this embodiment, the NAND controller 12 transmits the token to the next NAND controller 12 at the time when the sum of the power consumption of a plurality of processes is not more than $P_{max}$.

Figure 4:
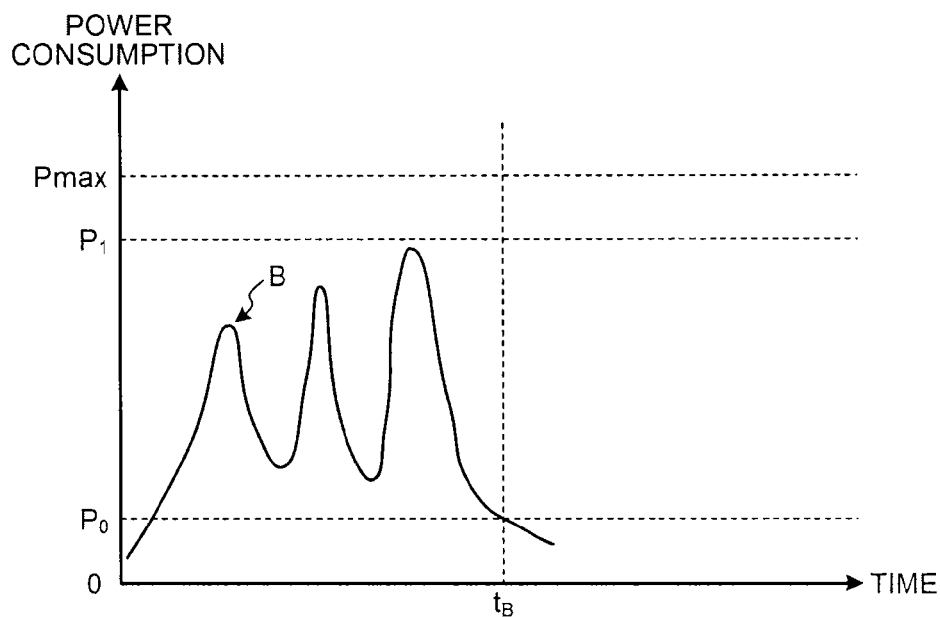
FIG. 4 is a diagram illustrating the transition characteristics of power consumption when a second process is performed for the NAND once.

However, there are plural kinds of processes in the NAND 11. For example, a case in which there is a process B in addition to the process A is considered. FIG. 4 is a diagram illustrating the transition characteristics of power consumption when a second process is performed for the NAND once. Next, the relation between the time elapsed from the start of a process and power consumption when the process B (second process) is performed for the NAND 11a will be described.

The process B is any one of the writing of data to the NAND 11, the reading of data from the NAND 11, and the erasing of data from the NAND 11. In addition, $t_B$ is the time when the power consumption of the process B is finally equal to $P_0$. It is assumed that the process A has the more maximum power consumption (peak value) than that of the process B between the process A and the process B. It is assumed that the maximum power consumption of the process A is $P_1$. In addition, it is assumed that a changed in the power consumption of the process B with the time elapsed from the start of the process B is represented by a graph illustrated in FIG. 4.

For example, it is considered that the process A starts for two NANDs 11 and then the process B starts therefor. In this case, as described above, the first NAND controller 12 may transmit the token to the second NAND controller 12 after the time $t_A$ has elapsed. Specifically, the first NAND controller 12 transmits the token to the second NAND controller 12 after the time $t_A$ has elapsed from the time when the first NAND controller 12 has instructed the first NAND 11 to start the process A. Then, the second NAND controller 12 receives the token and instructs the second NAND 11 to perform the process B.

Figure 5:
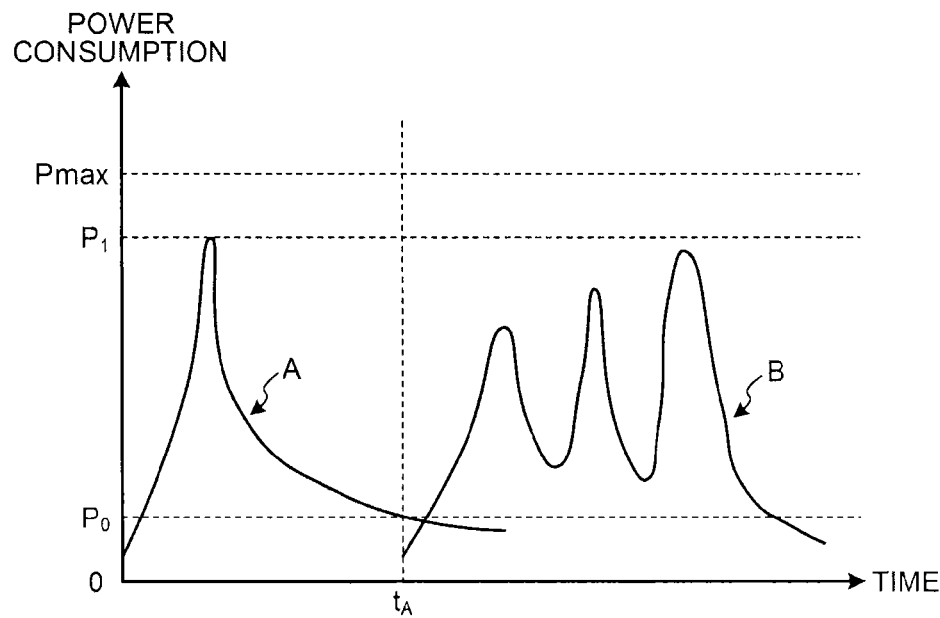
FIG. 5 is a diagram illustrating the transition characteristics of power consumption when the second process is performed for a second NAND after the first process is performed for a first NAND.

A graph of FIG. 5 illustrates a change in the power consumption of the system with the time elapsed from the start of the process A in the above-mentioned case. FIG. 5 is a diagram illustrating the transition characteristics of power consumption when the second process is performed for the second NAND after the first process is performed for the first NAND. Next, the relation between the time elapsed from the start of the process and power consumption when the process B is performed for the second NAND 11 (for example, the NAND 11b) after the process A is performed for the first NAND 11 (for example, the NAND 11a) will be described.

Of the graphs (displacement of power consumption) illustrated in FIG. 5, a front graph on the time axis indicates a change in the power consumption of the process A and a rear graph on the time axis indicates a change in the power consumption of the process B. In FIG. 5, a portion in which the process A and the process B overlap each other is a time period for which the process A and the process B are performed at the same time. There is the portion in which the process A and the process B overlap each other, but the maximum power consumption of each of the process A and the process B is equal to or less than $P_1$. Therefore, the power consumption of the process A is not more than $P_0$ after the time $t_A$ has elapsed from the start of the process. Therefore, even when the process A and the process B overlap each other as illustrated in FIG. 5, there is no time period for which the maximum power consumption is more than $P_{max}$.

In the graph illustrated in FIG. 5, the NAND controller 12a transmits the token to the NAND controller 12b after the time $t_A$ has elapsed. Specifically, the NAND controller 12a transmits the token to the NAND controller 12b after the time $t_A$ has elapsed from the time when the NAND controller 12a has instructed the NAND 11a to start the process A. Then, the NAND controller 12b receives the token and performs the process B for the NAND 11b.

Figure 6:
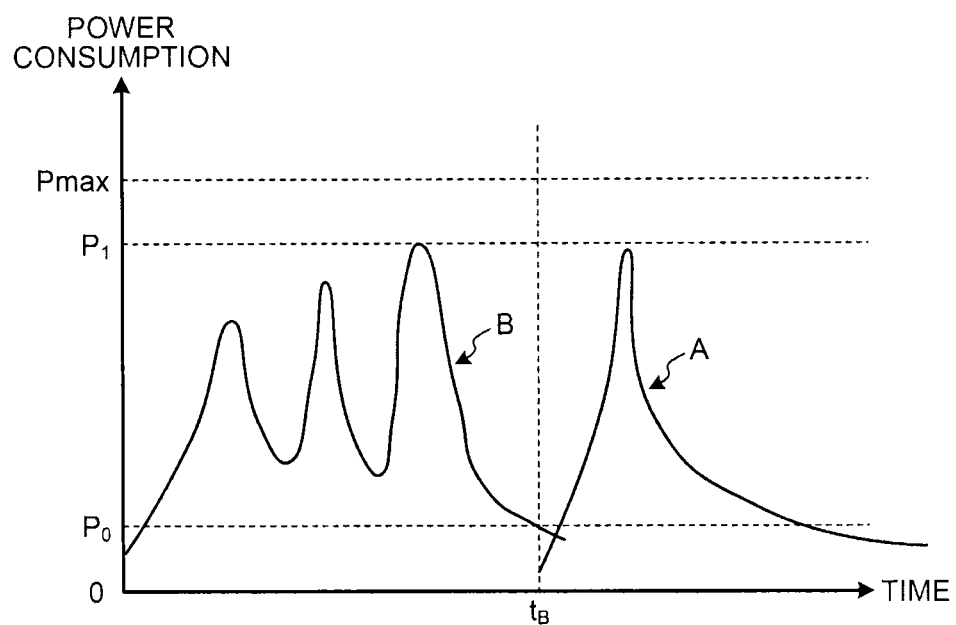
FIG. 6 is a diagram illustrating the transition characteristics of power consumption when the first process is performed for the second NAND after the second process is performed for the first NAND.

In the example illustrated in FIG. 5, the preceding process is the process A and the subsequent process is the process B. However, the processes may be reversed. In this case, similarly, the maximum power consumption can be equal to or less than $P_{max}$. FIG. 6 is a diagram illustrating the transition characteristics of power consumption when the first process is performed for the second NAND after the second process is performed for the first NAND. Next, the relation between the time elapsed from the start of a process and power consumption when the process A is performed for the second NAND 11 (for example, the NAND 11b) after the process B is performed for the first NAND 11 (for example, the NAND 11a) will be described.

Of the graphs illustrated in FIG. 6, a front graph on the time axis indicates a change in the power consumption of the process B and a rear graph on the time axis indicates a change in the power consumption of the process A. Even when the process A is performed after the process B, the NAND controller 12a may transmit the token to the NAND controller 12b after a time $t_B$ has elapsed. Specifically, the NAND controller 12a transmits the token to the NAND controller 12b after the time $t_B$ has elapsed from the time when the NAND controller 12a has instructed the NAND 11a to start the process B. Then, the NAND controller 12b receives the token and performs the process A for the NAND 11b.

The maximum power consumption of each of the process B and the process A is equal to or less than $P_1$. Therefore, the power consumption of the process B is not more than $P_0$ after time $t_B$ has elapsed from the start of the process. Therefore, even when the process B and the process A overlap each other as illustrated in FIG. 6, there is no time period for which the maximum power consumption is more than $P_{max}$.

Figure 7:
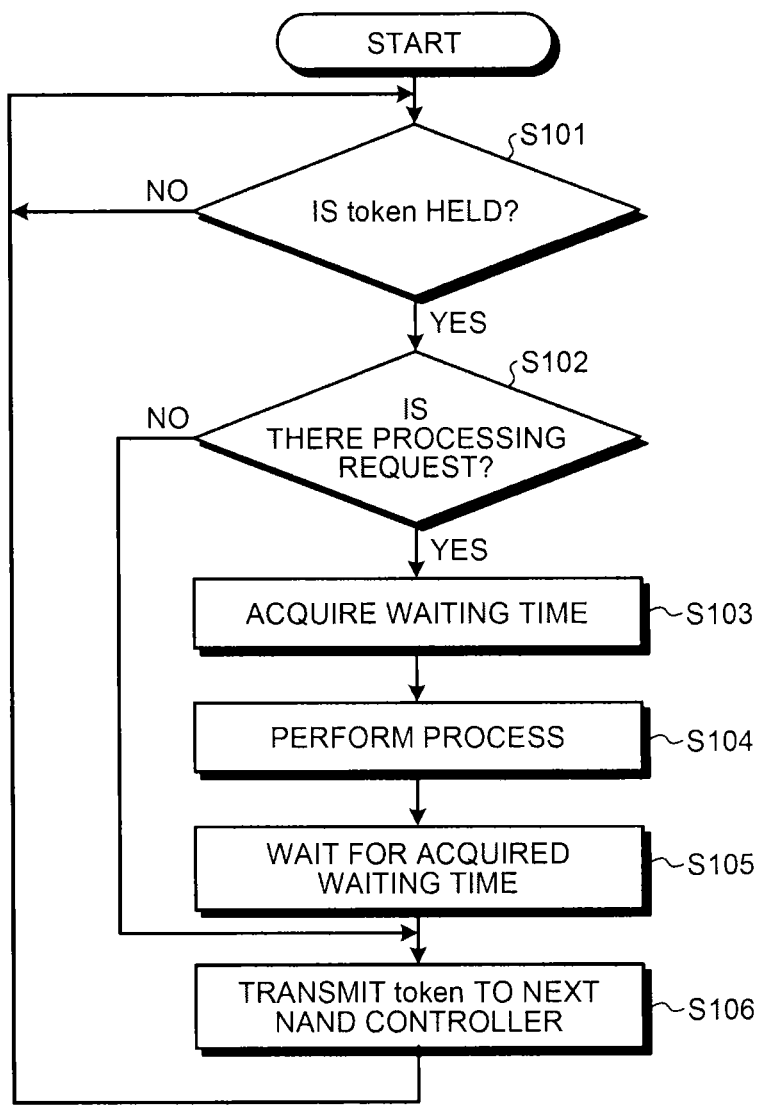
FIG. 7 is a flowchart illustrating the procedure of the process of the storage device according to the first embodiment.

FIG. 7 is a flowchart illustrating the procedure of the process of the storage device according to the first embodiment. Next, the procedure of the process of the storage device 1A when the process start time of each NAND 11 is controlled by the token will be described.

When the NAND controller 12 does not have the token, the NAND controller 12 is not be able to perform a process for the NAND 11. Therefore, the NAND controller 12 checks whether it has the token (Step S101). When the NAND controller 12 does not have the token (No in Step S101), it waits until the token is transmitted.

When the NAND controller 12 has the token (Yes in Step S101), it checks whether there is a request to perform a process for the NAND 11 which is controlled by the NAND controller 12 (Step S102). When there is no process request (No in Step S102), the NAND controller 12 transmits the token to the next NAND controller 12 (Step S106). In this case, for example, the NAND controller 12 instantly transmits the token to the next NAND controller 12.

The NAND controller 12 may hold the token for a predetermined period of time. In this case, the NAND controller 12 transmits the token to the next NAND controller 12 when the process request is not received while the NAND controller 12 has the token. On the other hand, when the process request is received while the NAND controller 12 has the token, the NAND controller 12 regards that the process request is issued.

Any method may be used to determine the NAND controller 12 to which the token will be transmitted. For example, unique identification numbers may be allocated to the NAND controllers 12 provided in the computer system and the token may be transmitted in the order of the numbers. In this case, the NAND controller 12 transmits the token to the NAND controller 12 with the next identification number. As such, the token is not circulated such that a specific NAND controller 12 is advantageous or a specific NAND controller 12 is disadvantageous. In other words, an equal opportunity to acquire the token is given to all of the NAND controllers 12. However, an equal opportunity to acquire the token is not necessarily given to all of the NAND controllers 12.

When the NAND controller 12 has the token and there is a request to perform the process for the NAND 11 which is controlled by the NAND controller 12 (Yes in Step S102), the NAND controller 12 performs the process for the NAND 11 which is controlled by the NAND controller 12.

In this case, the NAND controller 12 acquires the waiting time from the start of the process to the transmission of the token (Step S103). The waiting time is the time until the NAND controller 12 transmits the token (to the next NAND controller 12). As described above, the waiting time varies depending on the kind of process performed. The transition characteristics of power consumption are registered for each process in the NAND controller 12 in advance. The NAND controller 12 acquires (derive) the waiting time until the token is transmitted, on the basis of the transition characteristics of power consumption.

After acquiring the waiting time, the NAND controller 12 instructs the NAND 11 to actually start a process (Step S104). Then, the NAND controller 12 holds the token for the acquired waiting time (Step S105). The NAND controller 12 transmits the token to the next NAND controller 12 after the acquired waiting time has elapsed from the time when the NAND controller 12 has instructed the NAND 11 to start a process (Step S106). After transmitting the token to the next NAND controller 12, the NAND controller 12 waits for the token.

The process (Steps S101 to S106) illustrated in FIG. 7 is performed for each NAND controller 12 to control the maximum power consumption of the computer system.

Modification 1

In this embodiment, the procedure of the process when one token is provided has been described. However, a plurality of tokens may be provided. The number of tokens can be calculated on the basis of the allowable maximum power consumption of the computer system.

For example, the number of tokens in the storage device 1A is the quotient of the allowable $P_{max}$ (maximum power consumption) of the computer system divided by the maximum value (for example, the peak value of the power consumed by the process A) among the peak values of the power consumption of each process of the NAND 11.

For example, in general, in a case in which the allowable $P_{max}$ (maximum power consumption) of the computer system is equal to or more than two times the power consumption $P_1$ and is less than three times the power consumption $P_1$, when the number of tokens is two, the power consumption of the computer system is not more than the allowable maximum power consumption for an allowable period.

In this case, the procedure of the process of the NAND controller 12 is the same as that in the flowchart illustrated in FIG. 7. When the number of tokens increases, the probability of each NAND controller 12 having the token increases.

When one NAND controller 12 acquires a plurality of tokens at the same time, the NAND controller 12 may hold one token and transmit the other tokens to the next NAND controller 12. In addition, the NAND controller 12 may increase or decrease the number of tokens depending on the operation state of the computer system.

Modification 2

In this embodiment, the NAND controller 12 transmits the token to the next NAND controller 12 after a time ($t_A$ or $t_B$) shorter than the time required for the process A or the process B has elapsed. In this way, the maximum power consumption of the entire computer system is controlled. According to this control operation, it is possible to perform two processes at the same time for a given time period and reduce the time required for all of the processes.

On the other hand, there is a computer system which needs to reduce average power consumption rather than to reduce the processing time or the maximum power consumption. In the case of the computer system, it is preferable that the time when two processes are performed at the same time be zero. In this case, after the process to be started by the NAND 11 is completed, the NAND controller 12 may transmit the token to the next NAND controller 12.

Specifically, in Step S103 of FIG. 7, the waiting time acquired by the NAND controller 12 is set to the time until each process is completed. In addition, the NAND controller 12 may not acquire the waiting time. After the NAND 11 actually starts the process, the NAND controller 12 may wait until the process of the NAND 11 is completed and then transmit the token to the next NAND controller 12.

Modification 3

In this embodiment, the waiting time ($t_A$ or $t_B$) until the token is transmitted to the next NAND controller 12 after the NAND 11 is instructed to start the process is uniformly determined. However, the waiting time $t_A$ or $t_B$ may vary depending on the state of each NAND 11.

It has been known that the NAND 11 is impoverished with use and the characteristics thereof are changed. The change in the characteristics causes a change in the processing time of each process of the NAND 11. Therefore, the waiting time until the token is transmitted may be changed on the basis of the impoverished state of the NAND 11. In this case, each NAND controller 12 calculates the impoverished state of the NAND 11 on the basis of the use history of the NAND 11 controlled by the NAND controller 12. Then, each NAND controller 12 sets the waiting time until the token is transmitted, on the basis of the impoverished state of the NAND 11. Specifically, each NAND controller 12 changes the waiting time $t_A$ or $t_B$ depending on the degree of impoverishment of each NAND 11. In this way, it is possible to effectively use each NAND 11.

The NAND controller 12 may calculate the impoverished state of the NAND 11 for each chip, each block, or each page.

Since the characteristics of the NAND 11 are changed depending on the impoverished state of the NAND 11, the transition characteristics of power consumption are also changed depending on the impoverished state of the NAND 11. Therefore, the NAND controller 12 changes the transition characteristics of power consumption depending on the use conditions of the storage device 1A and then changes the waiting time until the token is transmitted. Examples of the use conditions of the storage device 1A include the number of erasing operations, the number of error correction bits during reading, and the time required for each process of the NAND 11.

The NAND controllers 12a to 12d change the transition characteristics of power consumption depending on the use conditions of at least one of the NANDs 11a to 11d. The transition characteristics of power consumption may be changed for each of the NANDs 11a to 11d.

The waiting time until the token is transmitted is changed, for example, when the number of erasing operations reaches a predetermined value, when the number of error correction bits during reading is more than a predetermined value, or when the time required for each process is more than a predetermined value.

Modification 4

In Modification 3, the waiting time until the token is transmitted is changed while the NAND 11 incorporated into the storage device is being used. The NAND 11 is a physical device and there is a difference between the individual NANDs 11. Therefore, it is assumed that, even when the NANDs 11 performs the same process, the time required for the process is different.

Therefore, before the NAND 11 is incorporated into the storage device and is then used, the initial characteristics of the NAND 11 may be measured and the waiting time until the token is transmitted may be set for each NAND 11 on the basis of the initial characteristics of the NAND 11.

Specifically, the time required for each process or a change in the power consumption of each process is acquired as the initial characteristics of the NAND 11 for each NAND 11. The optimal waiting time until the token is transmitted to the next NAND controller 12 is set to each NAND controller 12 on the basis of the initial characteristics of each NAND 11. Specifically, different waiting times $t_A$ or $t_B$ are used for each NAND 11. Therefore, it is possible to effectively use each NAND 11.

Modification 5

In this embodiment, when the NAND controller 12 does not have the token, it waits until the token is acquired while checking whether the token is held therein.

In the storage device 1A, when the NAND controller 12 does not have the token, it changes to the low power consumption mode to reduce the power consumption of the entire computer system. This method is effective when the computer system includes a large number of chips of the NANDs 11. For example, when the number of NAND controllers 12 is X and the number of tokens is Y, the number of NAND controllers 12 without the token is X-Y. Therefore, when the number of chips of the NANDs 11 in the computer system increases, X increases and the value of X-Y increases. As a result, the effect of reducing power consumption is improved.

Specifically, when the NAND controller 12 transmits the token to the next NAND controller 12, it changes from the normal mode to the low power consumption mode. When a first event occurs (for example, it is the turn of the NAND controller 12 to receive the token or to circulate the token and the process of the NAND 11 ends), the NAND controller 12 returns to the normal mode from the low power consumption mode.

The low power consumption mode may be any mode. For example, clock gating, power gating using power source separation, or a reduction in operating frequency may be considered as the low power consumption mode.

Modification 6

In Modification 5, the NAND controller 12 constantly changes to the low power consumption mode until the token is transmitted to another NAND controller 12 and is then received again. As a method of reducing power consumption more effectively than Modification 5, the NAND controller 12 may use a plurality of low power consumption modes with different power consumption levels.

When the number of chips of the NANDs 11 in the computer system increases, it is assumed that it takes a long time until the NAND controller 12 receives the token after the token is transmitted to the next NAND controller 12. Immediately after the NAND controller 12 transmits the token to the next NAND controller 12, it changes to the low power consumption mode in which power consumption is minimized. In addition, in the stage in which it is time for the NAND controller 12 to receive the token which is circulated, the NAND controller 12 may return to the low power consumption mode in advance, or it may change to another low power consumption mode with a short return time.

For example, after transmitting the token to the next NAND controller 12, the NAND controller 12 changes to a first low power consumption mode. When a predetermined first event occurs (for example, it is time for the NAND controller 12 to receive the token), the NAND controller 12 changes to a second low power consumption mode. When a predetermined second event occurs (for example, the NAND controller 12 receives the token), the NAND controller 12 returns to the normal mode from the second low power consumption mode.

For example, the NAND controller 12 changes to the low power consumption mode or a plurality of low power consumption modes for the period from the transmission of the token to the next NAND controller 12 (Step S106) to the operation of checking whether the NAND controller 12 has the token (Step S101).

Figure 8:
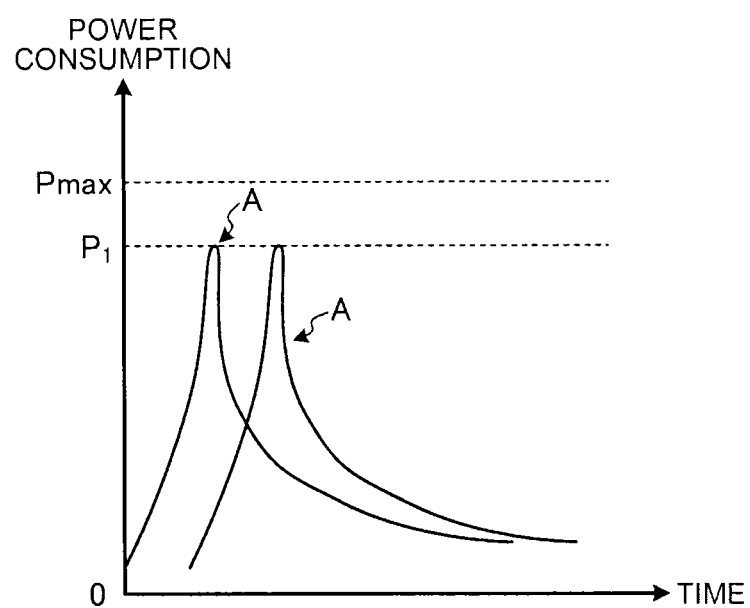
FIG. 8 is a diagram illustrating the transition characteristics of power consumption when the first process is continuously performed for two NANDs at a short time interval.

In some cases, when each NAND controller 12 operates considering only the NAND 11 which is controlled by the NAND controller 12, two NANDs 11 are instructed to continuously perform the process A at a short time interval, as illustrated in FIG. 8. In some case, for example, each NAND controller 12 operates, regardless of the processes performed by other NAND controllers 12 or regardless of the operations of the NANDs 11 controlled by other NAND controllers 12 and the power consumption of the operations.

FIG. 8 is a diagram illustrating the transition characteristics of power consumption when two NANDs are instructed to continuously perform the first process at a short time interval. Next, the relation between the time elapsed from the start of a process and power consumption when the process A starts for the first NAND 11 (for example, the NAND 11a) and immediately starts for the second NAND 11 (for example, the NAND 11b) will be described.

Of the graphs illustrated in FIG. 8, each of the front and rear graphs on the time axis indicates a change in the power consumption of the process A. As illustrated in FIG. 8, the maximum power consumption of the process A of each NAND 11 is $P_1$ and is less than $P_r$. However, when the two front and rear graphs overlap each other (the power consumption of each process is calculated), there is a moment when power consumption is more than $P_{max}$.

In recent years, with an increase in the capacity of, for example, an SSD, the number of NANDs 11 provided in the computer system has increased. The power consumption of each NAND 11 is less than the maximum power consumption of the computer system. However, when the operations of a plurality of NANDs 11 overlap each other, the overall power consumption of the NANDs 11 is more than the maximum power consumption of the computer system. The fundamental problem of this phenomenon is that the NAND controller 12 operates only under the constraints that, when the NAND 11 which is controlled by the NAND controller 12 can be operated, the NAND controller 12 performs the process.

In this embodiment, the token is transmitted and received between the NAND controllers 12 to limit the time when each NAND controller 12 instructs the NAND 11 to start a process.

In this embodiment, the storage device 1A includes the NANDs 11. However, the storage device 1A may be configured so as to include both the NAND 11 and an HDD. In addition, the storage device 1A may include, for example, a FeRAM, a DRAM, or an MRAM, instead of the NAND 11.

The NAND controller 12 may transmit the token to the next NAND controller 12 at a time slightly earlier than the time ($t_4$) when power consumption is finally equal to $P_0$, considering the time required to transmit and receive the token.

As such, according to the first embodiment, until the power consumption of the process of the NAND 11 is reduced to be less than $P_0$, other NANDs 11 are not allowed to perform the process. Therefore, it is possible to reduce the maximum power consumption during data access.

Second Embodiment

Next, a second embodiment will be described with reference to FIGS. 9 to 14. In the first embodiment, for a predetermined period of time after the process of the NAND 11 starts, other NANDs 11 are controlled such that they cannot start their processes, thereby reducing the maximum power consumption of the entire computer system.

In the second embodiment, when the power consumption of the process of any NAND 11 is less than the maximum power consumption, other NANDs 11 are allowed to start their processes ahead of schedule. In this embodiment, a process reservation table (reservation management table) is set and each process is performed on the basis of the reservation table.

Figure 9:
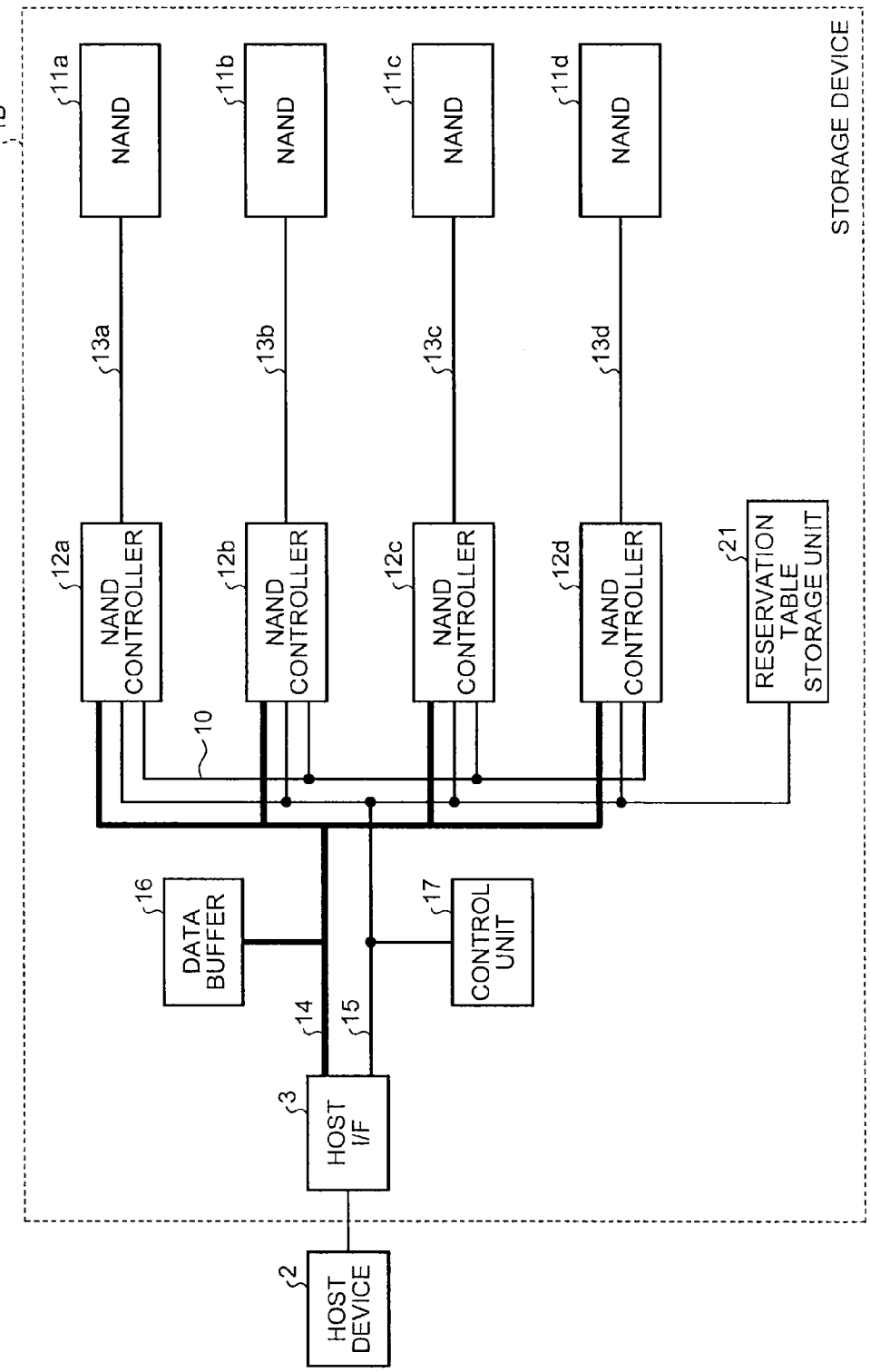
FIG. 9 is a diagram illustrating the structure of a storage device according to a second embodiment.

FIG. 9 is a diagram illustrating the structure of a storage device according to the second embodiment. In FIG. 9, components having the same functions as those in the storage device 1A according to the first embodiment illustrated in FIG. 1 are denoted by the same reference numerals and the description thereof will not be repeated.

A storage device 1B includes a reservation table storage unit 21, in addition to the components of the storage device 1A. The reservation table storage unit 21 is connected to a control bus 15. Therefore, the reservation table storage unit 21 is connected to NAND controllers 12a to 12d, a control unit 17, and a host I/F 3.

The reservation table storage unit 21 is, for example, a memory which stores a table (reservation table) in which the order of processes is reserved. A time period for which the power consumption of each process is more than $P_0$ (a period for which the power consumption is more than Pd is registered in the reservation table. Specifically, the time (start time) when the power consumption of the started process is initially more than $P_0$ and the time (end time) when the power consumption of the started process is finally less than $P_0$ are registered in the reservation table.

In this embodiment, the NAND controller 12 registers each process in the reservation table on condition that power consumption is not more than $P_{max}$ even when a plurality of processes are performed at the same time. When the plurality of processes are performed at the same time and the power consumption thereof is more than $P_{max}$, the NAND controller 12 registers each process in the reservation table in the order in which the processes are requested to be processed. The NAND controller 12 performs each process in the chronological order of the reservation time registered in the reservation table on the basis of the reservation table stored in the reservation table storage unit 21.

Figure 10:
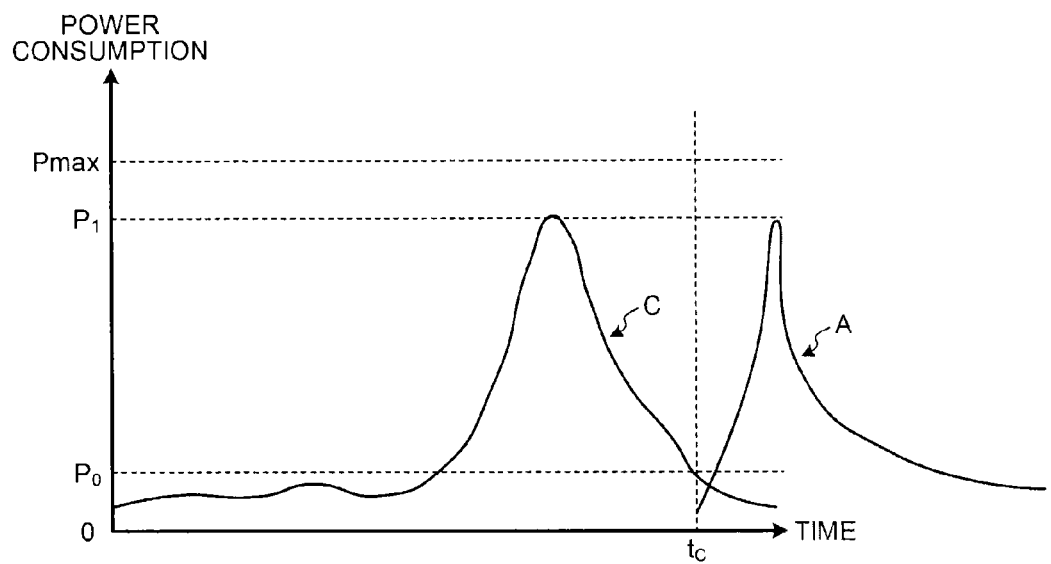
FIG. 10 is a diagram illustrating the transition characteristics of power consumption when each process is performed in the order in which a token is received.

FIG. 10 is a diagram illustrating the transition characteristics of power consumption when each process is performed in the order in which the token is received. FIG. 10 illustrates the transition characteristics of power consumption when a first process is performed for a second NAND after a third process in which the first half consumes a small amount of power is performed for a first NAND. Next, the relation between the time elapsed from the start of a process and power consumption when a process A is performed for the second NAND 11 (for example, a NAND 11b) after a process C (third process) is performed for the first NAND 11 (for example, a NAND 11a) will be described. In FIG. 10, $t_C$ is the time when the power consumption of the process C is finally equal to $P_0$.

The process C is any one of the writing of data to the NAND 11, the reading of data from the NAND 11, and the erasing of data from the NAND 11. As can be seen from the procedure of the process illustrated in FIG. 10, the maximum power consumption of the process C appears at the second half of the time required for the process C. In this case, when the NAND controller 12a for controlling the NAND 11 which starts the process C does not transmit the token to the next NAND controller 12b for the period from the start of the process C to $t_C$, the time when the subsequent process A can start shifts to the rear side. However, the first half (a time period for which power consumption is small) of the time required for the process C is waste.

Figure 11:
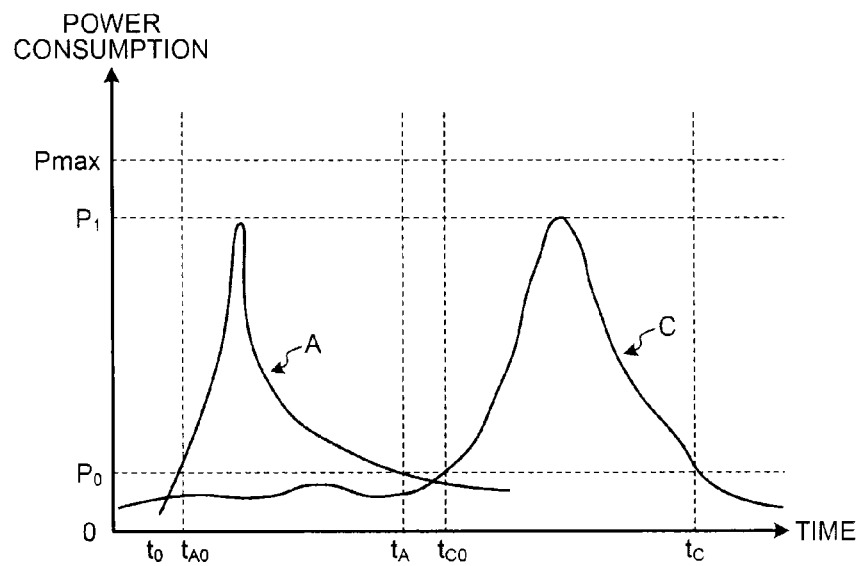
FIG. 11 is a diagram illustrating the transition characteristics of power consumption when the process which can be performed ahead of schedule is performed ahead of schedule.

In this case, the overlap between a graph indicating a change in the power consumption of the process A overtime and the first half of a graph indicating a change in the power consumption of the process C over time is illustrated in FIG. 11. FIG. 11 is a diagram illustrating the transition characteristics of power consumption when the process which can be performed ahead of schedule is performed ahead of schedule. FIG. 11 illustrates the transition characteristics of power consumption when the first process is performed ahead of schedule after the third process in which the first half consumes a small amount of power starts. Next, the relation between the time elapsed from the start of a process and power consumption when the process C is performed for the second NAND 11 (for example, the NAND 11b) ahead of schedule after the process A for the first NAND 11 (for example, the NAND 11a) starts will be described.

In FIG. 11, $t_{A0}$ is the time when the power consumption of the process A is equal to or more than $P_0$ first after the process starts and is the time elapsed from the start time of the process A. In addition, $t_{C0}$ is the time when the power consumption of the process C is equal to or more than $P_0$ first after the process starts and is the time elapsed from the start time of the process C.

As illustrated in FIG. 11, even when the process A and the first half of the process C are performed at the same time, the maximum power consumption of the process A is $P_1$ and the maximum power consumption of the first half of the process C is equal to or less than $P_0$. Therefore, the total maximum power consumption of the process A and the first half of the process C is equal to or less than the allowable maximum power consumption $P_{max}$ of the computer system.

When the NAND controller 12 can control the NAND 11 in the order illustrated in FIG. 11, it is possible to complete the process A earlier than that in the control operation illustrated in FIG. 10. Therefore, it is possible to improve the performance, such as the processing time, while maintaining the maximum power consumption of the entire computer system to be equal to or less than a predetermined value.

In this embodiment, the time $t_{C0}$ elapsed from the start time of the process when the power consumption of the process C is initially equal to or more than $P_0$ is set and the NAND controller 12 performs control such that other processes are not performed for a time period from $t_{C0}$ to $t_C$ on the basis of the start time of the process C. In other words, the NAND controller 12 does not allow other processes for the time period from $t_{C0}$ to $t_C$, but allows other processes for a time period from the start of the process C to $t_{C0}$. In this case, when the power consumption of another process which is interrupted in the process C is reduced to $P_0$ until the time $t_{C0}$, another process may not be completed until the time $t_{C0}$. In other words, when the time period for which power consumption is more than $P_0$ among the time periods of processes other than the process C ends at $t_{C0}$, the NAND controller 12 allows the interrupt of another process. The storage device 1B stores the process reservation table and performs a process ahead of schedule using the reservation table.

FIG. 12 is a diagram illustrating a reservation table in which the third process having the first half consuming a small amount of power is registered. FIG. 13 is a diagram illustrating a reservation table in which the third process having the first half consuming a small amount of power is registered and the first process is registered in the front stage of the third process. Next, a case in which the process C of the NAND 11a is registered in the reservation table and then the process A of the NAND 11b is registered ahead of schedule will be described.

As illustrated in FIGS. 12 and 13, the reservation table is a table in which a NAND number, a reservation start time, a reservation end time, and a valid flag are associated with each other. The NAND number identifies each of the NANDs 11a to 11d which perform the processes.

The reservation start time is the time when power consumption is more than $P_0$ first after the process starts. The reservation end time is the time when power consumption is finally equal to or less than $P_0$ after the process starts. When the process C is registered in the reservation table, the time (the time elapsed from the start of the process) $t_{C0}$ when the power consumption of the process C is more than $P_0$ first is stored as the reservation start time. In addition, the time (the time elapsed from the start of the process) $t_C$ when the power consumption of the process C is finally equal to or less than $P_0$ is stored as the reservation end time. In other words, the time period for which power consumption is likely to be more than $P_0$ in the processing time of the process to be performed is registered in the reservation table. The valid flag indicates whether the content of a reservation is valid. When the valid flag is 'valid', the content of the reservation is valid. When the valid flag is 'invalid', the content of the reservation is invalid.

In a situation in which the reservation (the process C of the NAND 11a) illustrated in FIG. 12 is made, when the token is transmitted to the NAND controller 12b which instructs another NAND 11b to perform the process A after the time $t_0$ has elapsed from the start of the process C, the following process is performed.

The NAND controller 12b acquires the time ($t_{A0}$) when the power consumption of the process A is more than $P_0$ first and the time ($t_A$) when the power consumption is finally less than $P_0$. Then, the NAND controller 12b adds the current time ($t_0$) to each of the times $t_{A0}$ and $t_A$ and acquires a time period for which the power consumption of the process A is more than $P_0$ when the process A is performed from now.

Then, the NAND controller 12b compares the time period ($t_{C0}$ to $t_C$) for which the process has been reserved with the acquired time period ($t_0+t_{A0}$ to $t_0+t_A$) for which the power consumption of the process A is more than $P_0$, on the basis of the reservation table.

In the example illustrated in FIG. 11, the process C is reserved for the time period from $t_{C0}$ to $t_C$. Therefore, the time period from $t_{C0}$ to $t_C$ for which the process C is reserved does not overlap the time period ($t_0+t_{A0}$ to $t_0+t_A$) for which the process A is reserved. Therefore, since the process A can be performed during the execution of the process C, the NAND controller 12b reserves the time period from $t_0+t_{A0}$ to $t_0+t_A$. When a plurality of reservations are made, each NAND controller 12 checks whether all reserved time periods overlap the time period to be reserved.

When a reservation can be made, the process which can be reserved is registered in the reservation table. The reservation table illustrated in FIG. 13 is obtained by registering the reserved process A in the reservation table illustrated in FIG. 12. The reservation of the time period from $t_0+t_{A0}$ to $t_0+t_A$ is added to the reservation table illustrated in FIG. 12. This reservation prevents a process from starting to be performed for the NAND 11 different from the NAND 11b for the time period from $t_0+t_{A0}$ to $t_0+t_A$. Therefore, the storage device 1B can perform control such that power consumption is not more than the allowable maximum power consumption of the computer system.

Figure 14:
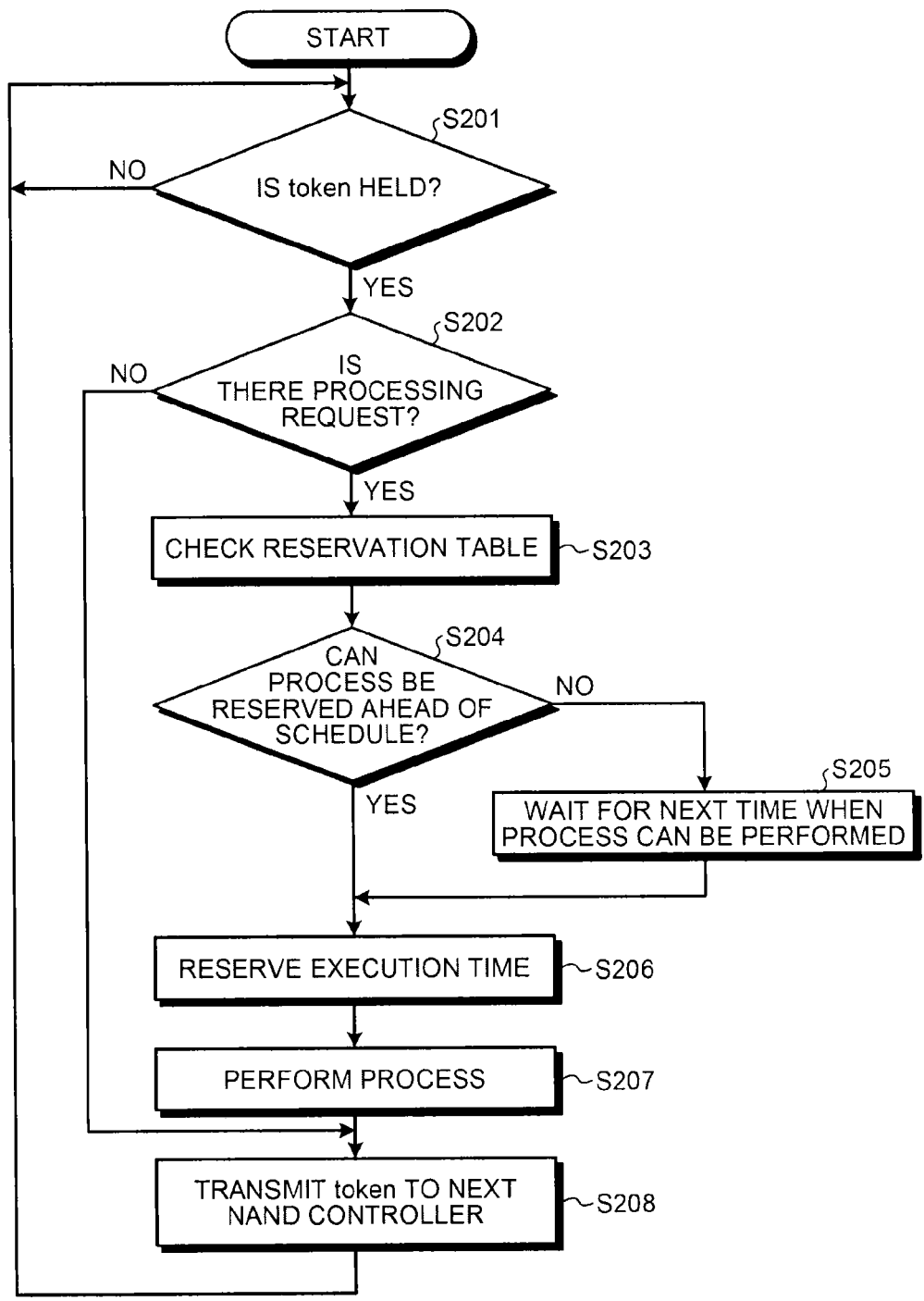
FIG. 14 is a flowchart illustrating the procedure of the process of the storage device according to the second embodiment.

FIG. 14 is a flowchart illustrating the procedure of the process of the storage device according to the second embodiment. A step of checking whether the token is held (Step S201) and a step of checking whether there is a request to instruct the NAND 11 to perform a process (Step S202) are the same as those in the first embodiment illustrated in FIG. 7 and the description thereof will not be repeated.

When the NAND controller 12 has the token and there is a request to instruct the NAND 11 which is controlled by the NAND controller 12 to perform a process (Yes in Step S202), the NAND controller 12 refers to the reservation table in the reservation table storage unit 21. The NAND controller 12 checks whether the process thereof can be reserved to the time period which is advanced, using the method illustrated in FIGS. 11 to 13 (Step S203).

When the NAND controller 12 is not be able to reserve the process ahead of schedule (No in Step S204), the NAND controller 12 waits for the time when the process thereof can be performed, on the basis of the reservation table (Step S205). Then, the NAND controller 12 registers (reserves) the execution time of its process in the reservation table (Step 206). When the NAND controller 12 is not be able to reserve the process ahead of schedule and the NAND controller 12 waits for another process, the NAND 11 is instructed to start the process at the start time of the time period to be reserved.

The NAND controller 12 may register its process to be performed in the last time period of the reservation table and wait for the time when the process thereof can be performed. In this case, the NAND controller 12 registers the process thereof at the end of the currently registered process. In other words, the NAND controller 12 reserves the process to be performed in the last time period of the reservation table.

When the NAND controller 12 can reserve the process thereof ahead of schedule (Yes in Step S204), it registers the execution time of the process thereof in the reservation table such that the process thereof is performed ahead of schedule (Step 206).

Then, the NAND controller 12 instructs the NAND 11 to actually start the process on the basis of the reservation table (Step S207). Then, after the process starts, the NAND controller 12 transmits the token to the next NAND controller 12 (Step S208). After transmitting the token to the next NAND controller 12, the NAND controller 12 waits for the token.

In this embodiment, the NAND controller 12 instructs the NAND 11 to actually start the process and transmits the token to the next NAND controller 12. However, the NAND controller 12 may register the process in the reservation table and transmit the token to the next NAND controller 12. In this case, the NAND controller 12 may transmit the token to the next NAND controller 12 before it instructs the NAND 11 to actually start the process.

The NAND controller 12 may instruct the NAND 11 to actually start the process before it registers the execution time of the process thereof in the reservation table such that the process is performed ahead of schedule. In this case, the NAND controller 12 instructs the NAND 11 to start the process and then registers the process instructed to start in the reservation table.

As such, according to the second embodiment, the process which can be performed ahead of schedule is performed ahead while the power consumption of the computer system is prevented from being more than the allowable maximum power consumption. Therefore, it is possible to complete a process in a short time while reducing the maximum power consumption during data access.

Third Embodiment

Next, a third embodiment will be described with reference to FIG. 15. In the first and second embodiments, the NAND controller 12 is connected to the NAND 11 by a dedicated line (NAND channel). In the third embodiment, a storage device is configured such that a plurality of NANDs 11 are connected to the NAND channel.

Figure 15:
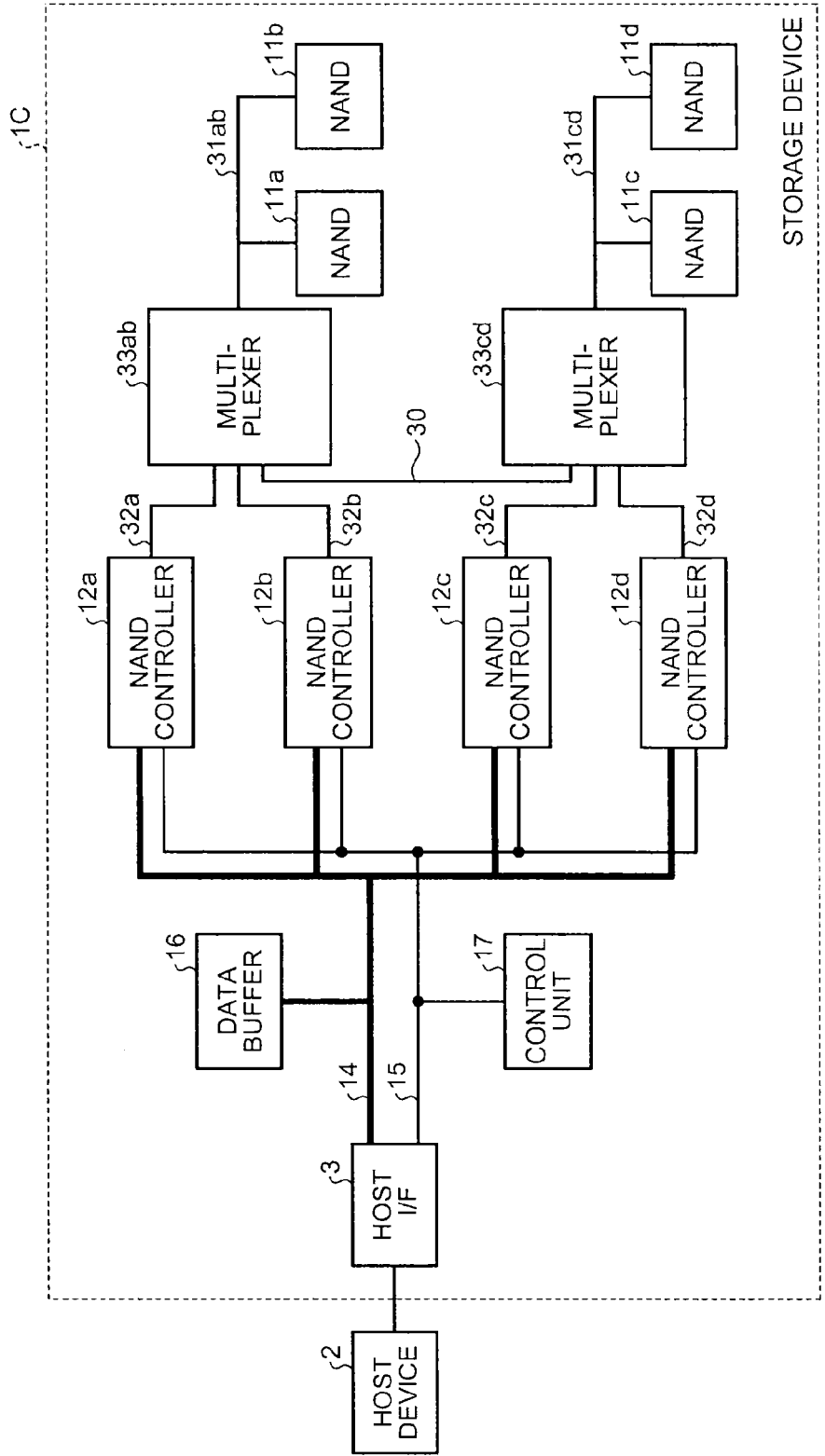
FIG. 15 is a diagram illustrating the structure of a storage device according to a third embodiment.

FIG. 15 is a diagram illustrating the structure of the storage device according to the third embodiment. In FIG. 15, components having the same functions as those in the storage device 1A according to the first embodiment illustrated in FIG. 1 are denoted by the same reference numerals and the description thereof will not be repeated. FIG. 15 illustrates a structure in which a storage device 1C does not include the reservation table storage unit 21. However, the storage device 1C may include the reservation table storage unit 21.

The storage device 1C includes multiplexers 33ab and 33cd and NAND channel multiplexed signal lines 32a to 32d, in addition to the components of the storage device 1A. In addition, the storage device 1C includes NAND channels 31ab and 31cd, instead of the NAND channels 13a to 13d. The storage device 1C includes a signal line 30, instead of the signal line 10.

A NAND controller 12a is connected to the multiplexer 33ab through the NAND channel multiplexed signal line 32a and a NAND controller 12b is connected to the multiplexer 33ab through the NAND channel multiplexed signal line 32b.

A NAND controller 12c is connected to the multiplexer 33cd through the NAND channel multiplexed signal line 32c and the NAND controller 12d is connected to the multiplexer 33cd through the NAND channel multiplexed signal line 32d.

The multiplexer 33ab is connected to NANDs 11a and 11b through the NAND channel 31ab and the multiplexer 33cd is connected to NANDs 11c and 11d through the NAND channel 31cd. As such, in the storage device 10, two NANDs 11a and 11b are connected to one NAND channel 31ab and two NANDs 11c and 11d are connected to one NAND channel 31cd.

The multiplexer 33ab and the multiplexer 33cd are connected to each other by the signal line 30. The signal line 30 is used to transmit and receive a token to and from each multiplexer. When the storage device 1C includes the reservation table storage unit 21, the reservation table storage unit 21 is connected to the signal line 30.

In the storage device 10, the multiplexers 33ab and 33cd control the NANDs 11 such that power consumption is not more than the allowable maximum power consumption of a computer system. As such, in the first or second embodiment, the NAND controller 12 exchanges the token or checks the reservation table. However, in this embodiment, the multiplexers 33ab and 33cd exchange the token or check the reservation table. In other words, in this embodiment, the NAND 11 is not controlled by the NAND controller 12, but is controlled by the multiplexers 33ab and 33cd.

As such, this embodiment is similar to the first and second embodiments except that the NAND 11 is not controlled by the NAND controller 12, but is controlled by the multiplexers 33ab and 33cd. Therefore, it is possible to obtain the same effect as that in the first and second embodiments.

As such, according to the first to third embodiments, it is possible to reduce the maximum power consumption during data access.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
    a first non-volatile memory;
    a second non-volatile memory;
    a first controller that controls the first non-volatile memory to cause the first non-volatile memory to perform processes;
    a second controller that controls the second non-volatile memory to cause the second non-volatile memory to perform processes; and
    a signal line which is connected to the first controller and the second controller and through which a token is transmitted between the first controller and the second controller;
    wherein the first controller is capable of controlling the first non-volatile memory while holding the token and the second controller is capable of controlling the second non-volatile memory while holding the token.

2. The storage device according to claim 1,
    wherein the first controller determines amount of time to hold the token based on the process which the first controller causes the first non-volatile memory to perform.

3. The storage device according to claim 1,
wherein the first controller determines a timing to transmit the token based on the power consumption transitional characteristics of the process which the first controller causes the first non-volatile memory to perform.

4. The storage device according to claim 3,
wherein the first and second controllers change the power consumption transitional characteristics to a new power consumption transitional characteristics depending on use conditions of the storage device which are changed while the storage device is used.

5. The storage device according to claim 3,
wherein the first controller changes the power consumption transitional characteristics to a new power consumption transitional characteristics depending on the number of erasing operations of the first and second non-volatile memory.

6. The storage device according to claim 3,
wherein the first controller changes the power consumption transitional characteristics to a new power consumption transitional characteristics depending on the number of error correction bits during a reading operation of the first non-volatile memory.

7. The storage device according to claim 3,
wherein the first controller changes the power consumption transitional characteristics to a new power consumption transitional characteristics depending on the time required for process performed by the first non-volatile memory.

8. The storage device according to claim 1,
wherein the first controller determines a timing to transmit the token based on the type of process which the first controller causes the first non-volatile memory to perform.

9. The storage device according to claim 1,
wherein the first controller transmits the token to the second controller after the first controller causes the first non-volatile memory to perform the process when the sum of power consumption of the first non-volatile memory and estimated power consumption of the second non-volatile memory is less than a predetermined amount.

10. The storage device according to claim 1,
wherein, when the token is received, the first controller causes the first non-volatile memory to perform the process, and
the first controller transmits the token to the second controller at a time when a transition of power consumption generated by the process of the first non-volatile memory is below a first threshold value.

11. The storage device according to claim 1, further comprising:
a third non-volatile memory; and
a third controller that controls the third non-volatile memory to cause the third non-volatile memory to perform processes,
wherein the signal line is further connected to the third controller and at least two tokens are transmitted between the first controller, second controller and third controller through the signal line.

12. The storage device according to claim 1,
wherein the first and second controllers change to a first low power consumption mode while they do not holding the token.

13. The storage device according to claim 12,
wherein the first and second controllers further change from the first low power consumption mode to a second low power consumption mode while they do not hold the token.

14. The storage device according to claim 1, further comprising:
a storage unit that stores a reservation management table in which a period for which the power consumption of the processes performed by the first and second non-volatile memories is greater than a first value is registered,
wherein, when the token is received, the first controller determines whether to cause the first non-volatile memory to perform the processes on the basis of the reservation management table,
when it is determined that the first non-volatile memory is caused to perform the processes, the first controller registers the period in the reservation management table and causes the first non-volatile memory to perform the processes, and
when it is determined that the first non-volatile memory is not caused to perform the processes, the first controller registers the period in a process which is finally performed in the reservation management table and performs the processes on the basis of the reservation management table.

15. The storage device according to claim 14,
wherein, at a start time of the period, a transition of the power consumption generated by the process of the first non-volatile memory while the process of the first non-volatile memory is performed is greater than the first value first, and
at an end time of the period, the transition of the power consumption generated by the process of the first non-volatile memory while the process of the first non-volatile memory is performed is finally less than the first value.

16. The storage device according to claim 14,
wherein, when the number of reservations of the processes performed by the first and second non-volatile semiconductor memories which overlap each other for the period is less than the number of tokens in the reservation management table, the first controller registers the period in the reservation management table and causes the first non-volatile memory to perform the processes.

* * * * *